(12) United States Patent
Jang

(10) Patent No.: US 7,549,092 B2
(45) Date of Patent: Jun. 16, 2009

(54) OUTPUT CONTROLLER WITH TEST UNIT

(75) Inventor: Ji-Eun Jang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 393 days.

(21) Appl. No.: 11/478,078

(22) Filed: Jun. 30, 2006

(65) Prior Publication Data

US 2007/0070792 A1 Mar. 29, 2007

(30) Foreign Application Priority Data

Sep. 29, 2005 (KR) .................. 10-2005-0090888
Dec. 27, 2005 (KR) .................. 10-2005-0130444

(51) Int. Cl.
*G11B 5/00* (2006.01)
(52) U.S. Cl. ..................... 714/700; 714/5; 714/707; 714/718; 714/721; 714/731; 714/744; 714/745; 714/814; 365/194; 365/189.16
(58) Field of Classification Search ............ None
See application file for complete search history.

(56) References Cited

U.S. PATENT DOCUMENTS

| 6,026,050 | A | 2/2000 | Baker et al. | |
|---|---|---|---|---|
| 6,574,758 | B1 | 6/2003 | Eccles | |
| 6,691,272 | B2 | 2/2004 | Azim | |
| 6,772,312 | B2 * | 8/2004 | Mes | 711/169 |
| 6,816,991 | B2 | 11/2004 | Sanghani | |
| 6,912,680 | B1 | 6/2005 | Keeth | |
| 6,952,462 | B2 | 10/2005 | Harrison | |
| 6,959,016 | B1 | 10/2005 | Keeth et al. | |
| 6,968,436 | B2 * | 11/2005 | Kumazawa | 711/167 |
| 7,230,864 | B2 * | 6/2007 | Ha et al. | 365/194 |
| 7,245,551 | B2 * | 7/2007 | Choi | 365/189.08 |
| 7,272,054 | B2 * | 9/2007 | Waldrop | 365/191 |
| 2004/0042312 | A1 | 3/2004 | Kim et al. | |
| 2006/0050574 | A1 * | 3/2006 | Streif et al. | 365/194 |
| 2006/0250883 | A1 * | 11/2006 | Szczypinski | 365/233 |

FOREIGN PATENT DOCUMENTS

| JP | 2004-95156 A | 3/2004 |
|---|---|---|
| TW | 200407903 | 5/2004 |
| TW | 594774 | 6/2004 |

* cited by examiner

*Primary Examiner*—John P Trimmings
(74) *Attorney, Agent, or Firm*—Mannava & Kang P.C.

(57) ABSTRACT

There is provided an output controller with a test unit, which can test an appropriate delay amount according to an operating frequency under a real situation. The output controller includes an initial synchronizing unit for outputting a first output enable signal when a read CAS signal is activated; a plurality of synchronizing units connected in series to output an output signal of a previous stage as an output enable signal in synchronization with a corresponding driving clock, a first stage of the synchronizing units receiving the first output enable signal; and a test unit for adjusting a delay amount of an input clock according to a test signal and outputting the driving clock.

28 Claims, 11 Drawing Sheets

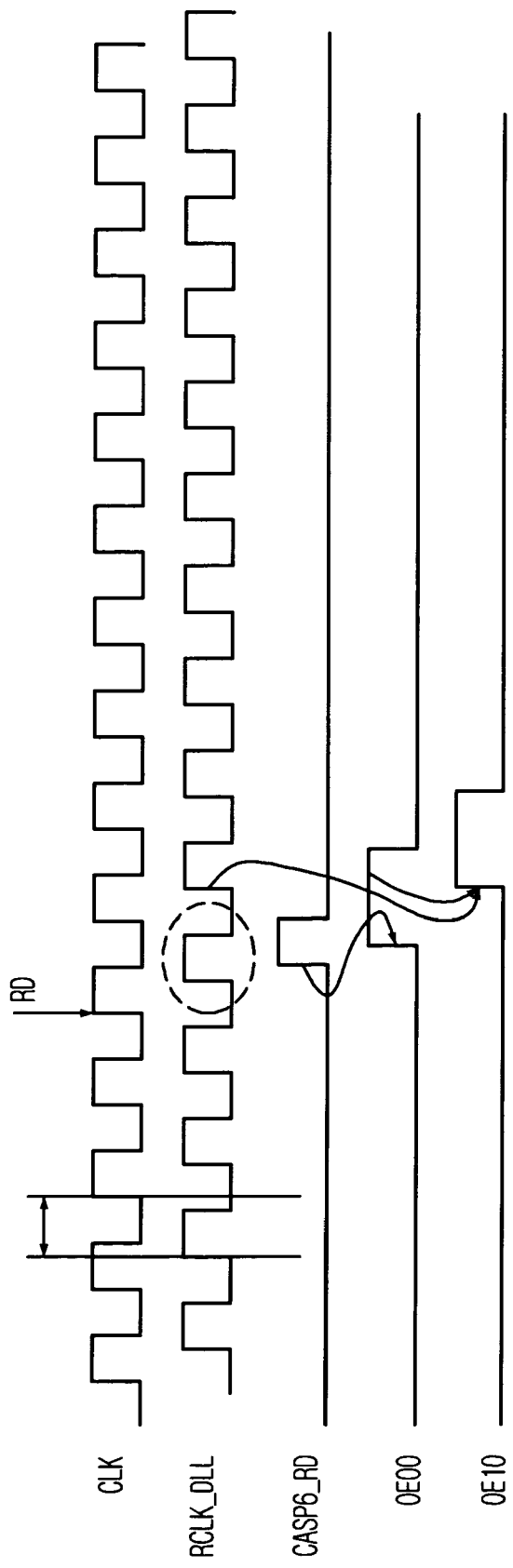

OUTPUT CONTROLLER WITH TEST UNIT

FIELD OF THE INVENTION

The present invention relates to a semiconductor memory device; and, more particularly, to an output controller with a test unit to control data output timing of a semiconductor memory device.

DESCRIPTION OF RELATED ARTS

As semiconductor memory devices are highly integrated, many attempts have been made to increase their operating speed. To achieve this purpose, synchronous memory devices which operate in synchronization with an external clock have been introduced.

A single data rate (SDR) synchronous memory device inputs and outputs one data via one data pin in synchronization with a rising edge of the external clock during one clock cycle.

However, the SDR synchronous memory device is insufficient to satisfy the speed requirement of a high-speed system. Thus, a double data rate (DDR) synchronous memory device which processes two data during one clock cycle has been proposed.

In the DDR synchronous memory device, two data are consecutively inputted and outputted through data input/output pins in synchronization with rising and falling edges of the external clock. The DDR synchronous memory device can implement at least two times the bandwidth of the SDR synchronous memory device without increasing the frequency of the clock, thus obtaining the high-speed operation.

Because the DDR memory device has to receive or output two data during one clock cycle, a data access method employed in the conventional synchronous memory device can no longer be used.

If the clock cycle is about 10 ns, two consecutive data must be substantially processed within about 6 nsec or less, except for the rising time and the falling time (about 0.5×4=2 ns) and time necessary for meeting other specifications. However, it is difficult to perform the process within the memory device. Therefore, the memory device operates in synchronization with the rising and falling edges of the clock only when inputting/outputting data from/to an external circuit. Substantially, the two data are processed in synchronization with one edge of the clock within the memory device.

In order to transfer data from a memory device to an internal core region or to output the transferred data to an external circuit, a new data access method is required.

The synchronous memory device uses several concepts different from those of the asynchronous memory device. One of them is CAS latency (CL). CAS latency is the number of clocks that are counted from an input of a read command to data output. If CL=3, it means that data are outputted to an external circuit after three clock cycles from an input of the read command. CAS latency determines data output timing. In an initial operation of the semiconductor memory device, a detected set CL value is used to access and output data.

Therefore, a data output enable signal is generated after an operating clock cycle is delayed as much as the set CAS latency. When the data output enable signal is activated, the accessed data is output in response to the read command.

The operating clock used is a delayed lock loop (DLL) clock obtained by delay locking an external clock by a predetermined time. This DLL clock is generated from a delay locked loop (DLL) circuit. In the synchronous semiconductor memory device, the data output has to be accurately synchronized with the rising and falling edges of the external clock. However, due to the delay time of the clock signal, which inevitably occurs during the internal processing, the data output cannot be accurately synchronized with the rising and falling edges of the external clock.

FIG. 1 is a block diagram of a conventional output controller.

Referring to FIG. 1, the output controller includes a clock delay unit 10, a selecting unit 20, an initial synchronizing unit 30, and a synchronizing unit 40. The clock delay unit 10 delays a rising DLL clock RCLK_DLL and a falling DLL clock FCLK_DLL by a predetermined time in response to CAS latency information signals CL3 to CL5. The selecting unit 20 selects signals corresponding to the CAS latency information signal CL3 to CL5 among the output signals of the clock delay unit 10 and outputs the selected signals as a plurality of driving clocks RCLK_OE10 to RCLK_OE35. The initial synchronizing unit 30 outputs an output enable signal OE00 when a read CAS signal CASP6_RD is activated. The synchronizing unit 40 synchronizes output signals of the selecting unit 20 with the corresponding driving clocks and the DLL clocks, and generates output enable signals OE10 to OE45.

For reference, the read CAS signal CASP6_RD is caused by a read operation within a semiconductor memory device, and only the CAS latency information signals CL3 to CL5 corresponding to the set CL are activated.

Although not shown in FIG. 1, the output enable signals OE00 to OE45 contain the information on the delay time elapsed from the activation of the read CAS signal CASP6_RD, and provides the CL information. In other words, when output driving signals ROUTEN and FOUTEN for controlling the data output are generated, the output enable signals OE00 to OE45 are used to satisfy the set CAS latency when the data output from a memory core block in response to the read command is output through a data pad.

An operation of the output controller that does not have the clock delay unit 10 and selecting unit 20 will be described below.

FIG. 2A is a waveform diagram of a conventional output controller when it operates at a low frequency.

Referring to FIG. 2A, when a read command RD is applied in synchronization with the external clock CLK, a corresponding read CAS signal CASP6_RD is activated.

Then, the initial synchronizing unit 30 activates the output enable signal OE00 in response to the read CAS signal CASP6_RD. The first synchronizing unit outputs the output enable signal OE10 in synchronization with the rising edge of the first rising DLL clock RCLK_DLL from the activation of the output enable signal OE00.

Although not shown, the second synchronizing unit activates the output enable signal OE15 by synchronizing the output enable signal OE10 of the first synchronizing unit with the falling DLL clock FCLK_DLL, and the third synchronizing unit activates the output enable signal OE20 by synchronizing the output signal OE15 of the second synchronizing unit with the rising DLL clock RCLK_DLL.

Through these procedures, a plurality of output enable signals OE00 to OE45 are activated in synchronization with the rising DLL clock RCLK_DLL and the falling DLL clock FCLK_DLL from the activation of the read CAS signal CASP6_RD.

However, as illustrated in FIG. 2B, if the output controller is operated at a high frequency, the output enable signal OE10 synchronized with the first rising DLL clock RCLK_DLL from the activation of the read CAS signal CASP6_RD cannot be activated.

Since the output controller operates at a high frequency, the edge of the first rising DLL clock RCLK_DLL leads the activation time of the output enable signal OE00 activated by the initial synchronizing unit 30. Therefore, the first synchronizing unit outputs the output enable signal OE10 in synchronization with the second rising DLL clock.

That is, since the activation time of the output enable signal generated from the output controller is delayed by one clock, the data outputted in synchronization with the output driving signal generated in response to the output enable signal cannot satisfy the set CAS latency, resulting in data failure.

To solve these problems, the conventional output controller further includes the clock delay unit for delaying the rising DLL clock and the falling DLL clock according to the CAS latency, and the selecting unit for outputting the corresponding clocks as the driving clocks according to the CAS latency.

To prevent data failure occurring when the first rising DLL clock is activated earlier than the read CAS signal, the conventional output controller adjusts the rising time point of the DLL clock according to frequency. However, due to the fixed delay amount, it is difficult to control the actual chip according to PVT variation.

SUMMARY OF THE INVENTION

It is, therefore, an object of the present invention to provide an output controller with a test unit capable of testing an appropriate delay amount according to an operating frequency under a real situation.

In accordance with an aspect of the present invention, there is provided an output controller including: an initial synchronizing unit for outputting a first output enable signal when a read CAS signal is activated; a plurality of synchronizing units connected in series, each for outputting an output signal of a previous stage as an output enable signal in synchronization with a corresponding driving clock, a first stage of the synchronizing units receiving the first output enable signal; and a test unit for adjusting a delay amount of an input clock according to a plurality of test signals and outputting the driving clock.

In accordance with another aspect of the present invention, there is provided a semiconductor device for controlling data output timing, including: an initial synchronizing unit for outputting a first output enable signal when a read CAS signal is activated; a plurality of synchronizing units, connected in series, each for outputting an output signal of a previous stage as an output enable signal in synchronization with a corresponding driving clock, the first synchronizing unit of the plurality of synchronizing units receiving the first output enable signal; and a test unit for adjusting a delay amount of an input clock based on a plurality of test-delay amount adjusting signals and outputting a plurality of driving clocks in response to a plurality of test off signals.

BRIEF DESCRIPTION OF THE DRAWINGS

The above and other objects and features of the present invention will become apparent from the following description of the preferred embodiments given in conjunction with the accompanying drawings, in which:

FIG. 2B is a waveform diagram for explaining the problems of a conventional output controller when it operates at a high frequency;

DETAILED DESCRIPTION OF THE INVENTION

An output controller in accordance with exemplary embodiments of the present invention will be described in detail with reference to the accompanying drawings.

Figure 1:
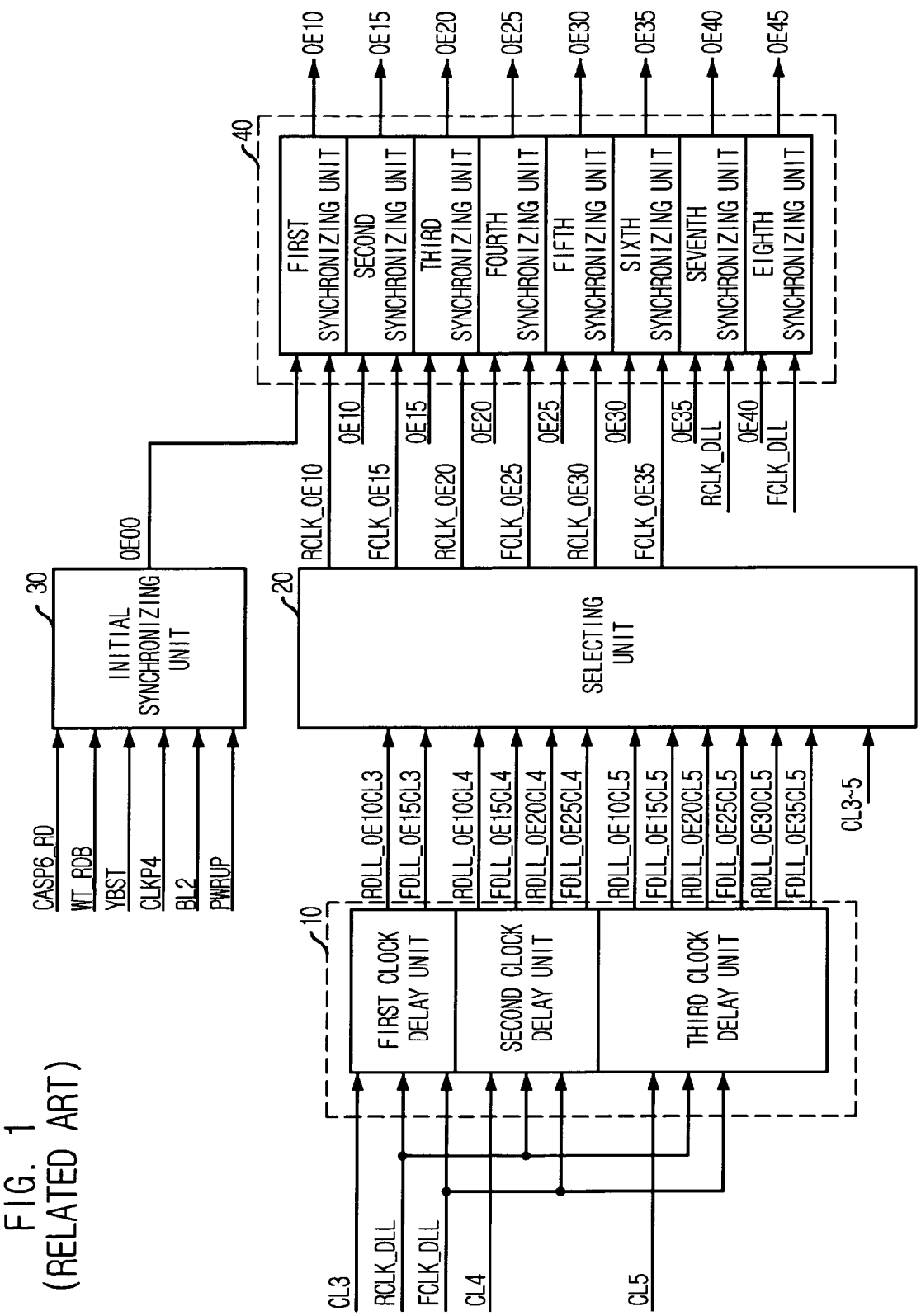
FIG. 1 is a block diagram of an output controller of the related arts.
Figure 2A:
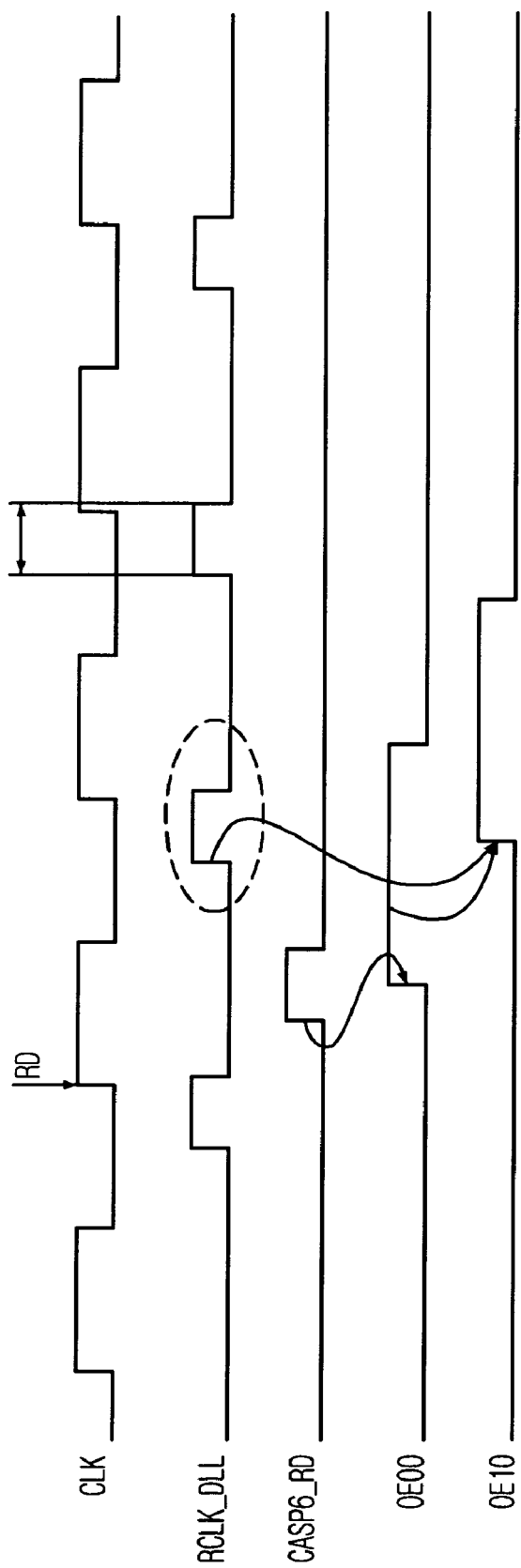
FIG. 2A is a waveform diagram of a conventional output controller when it operates at a low frequency.
Figure 3:
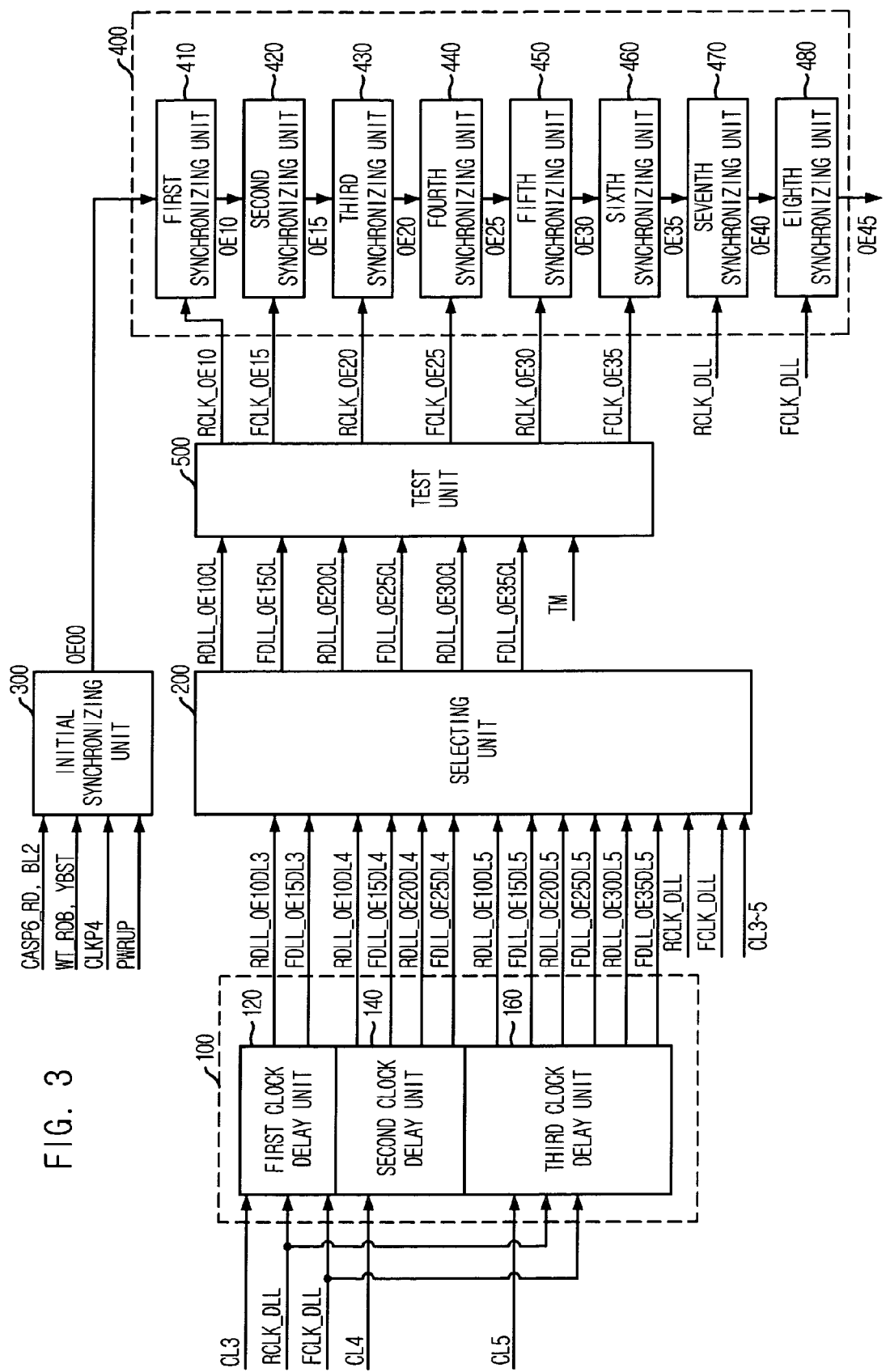
FIG. 3 is a block diagram of an output controller with a test unit in accordance with the present invention.

FIG. 3 is a block diagram of an output controller with a test unit in accordance with the present invention.

Referring to FIG. 3, the output controller in accordance with an embodiment of the present invention includes a clock delay unit 100, a selecting unit 200, an initial synchronizing unit 300, a plurality of synchronizing units 400 connected in series, and a test unit 500. The initial synchronizing unit 300 outputs an output enable signal OE00 when a read CAS signal CASP6_RD is activated. The synchronizing units 400 generates output enable signals OE10 to OE45 by synchronizing output signals of the respective previous stages with corresponding driving clocks RCLK_OE10 to FCLK_OE35 and rising and falling DLL clocks RCLK_DLL and FCLK_DLL. The test unit 500 controls each delay amount of input clocks RDLL_OE10CL to FDLL_OE35CL applied according to a test signal TM and outputs the driving clocks RCLK_OE10 to FCLK_OE35. The clock delay unit 100 delays the rising and falling DLL clocks RCLK_DLL and FCLK_DLL by a predetermined time in response to CAS latency information signals CL3 to CL5. The selecting unit 200 selects signals corresponding to the CAS latency information signal CL3 to CL5 among the output signals of the clock delay unit 100.

Since the output controller further includes the test unit 500 that can add the delay to the driving clocks RCLK_OE10 to FCLK_OE35 input to the synchronizing unit 400 for generating the output enable signals OE00 to OE45, the delay amount required according to frequency can be tested under the real chip situation.

The respective units of the output controller will be described below in detail with reference to the accompanying drawings.

Figure 4:
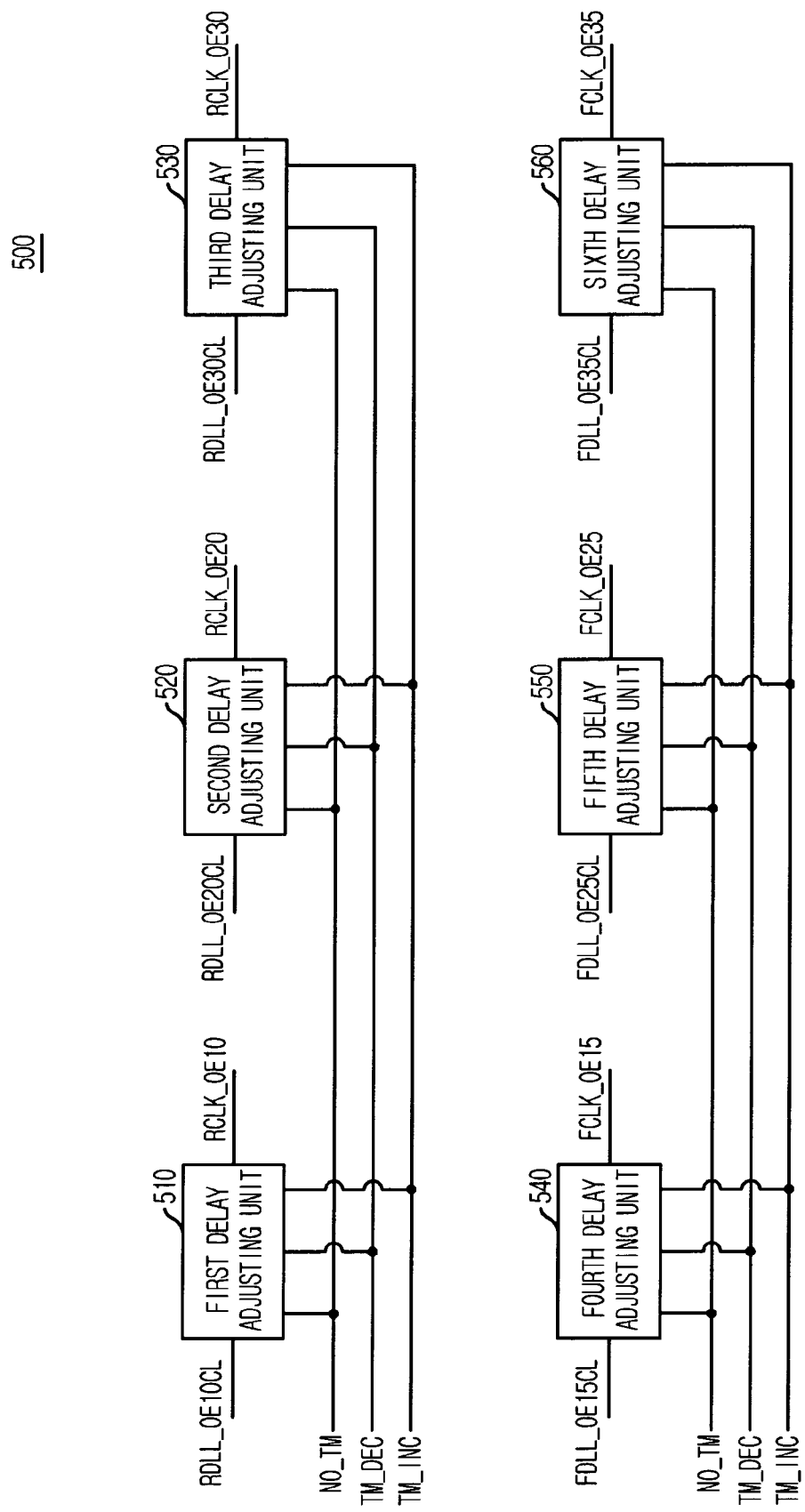
FIG. 4 is a circuit diagram of the test unit shown in FIG. 3 in accordance with a first embodiment of the present invention.

FIG. 4 is a circuit diagram of the test unit 500 of FIG. 3 in accordance with a first embodiment of the present invention.

Referring to FIG. 4, the test unit 500 includes first to sixth delay adjusting units 510, 520, 530, 540, 550 and 560 for outputting the driving clocks RCLK_OE10 to FCLK_OE35 by adjusting the delay amount of the input signals according to a test-delay increment signal TM_INC, a test-delay decrement signal TM_DEC and a test-delay normal signal NO_TM.

Figure 5:
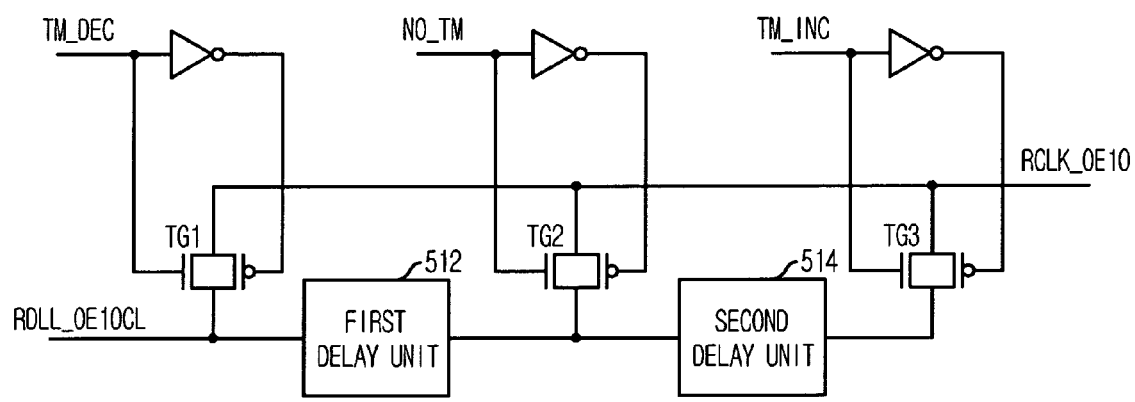
FIG. 5 is a circuit diagram of a delay adjusting unit shown in FIG. 4.

FIG. 5 is a circuit diagram of the first delay adjusting unit 510 of FIG. 4. The second to sixth delay adjusting units 520 to 560 have the identical circuit configurations to that of the first delay adjusting unit 510. The first delay adjusting unit 510 will be described as an exemplary structure.

Referring to FIG. 5, the first delay adjusting unit 510 includes a first delay unit 512, a second delay unit 514, a first transfer gate TG1, a second transfer gate TG2, and a third transfer gate TG3. The first and second delay units 512 and 514 are connected in series to delay the input signal. The first transfer gate TG1 transfers the input clock RDLL_OE10CL as the driving clock RCLK_OE10 in response to the test-delay decrement signal TM_DEC. The second transfer gate TG2 transfers an output signal of the first delay unit 512 as the driving clock RCLK_OE10 in response to the test-delay normal signal NO_TM. The third transfer gate TG3 transfers an output signal of the second delay unit 514 as the driving clock RCLK_OE10 in response to the test-delay increment signal TM_INC.

In the delay adjusting unit 510, the signal delayed by the first delay unit 512 is output as the driving clock RCLK_OE10 when the test-delay normal signal NO_TM is activated, and the signals delayed by the first and second delay units 512 and 514 are output as the driving clock RCLK_OE10 when the test-delay increment signal TM_INC is activated. When the test-delay decrement signal TM_DEC is activated, the input clock RDLL_OE10CL is output as the driving clock RCLK_OE10 without delay.

Figure 6:
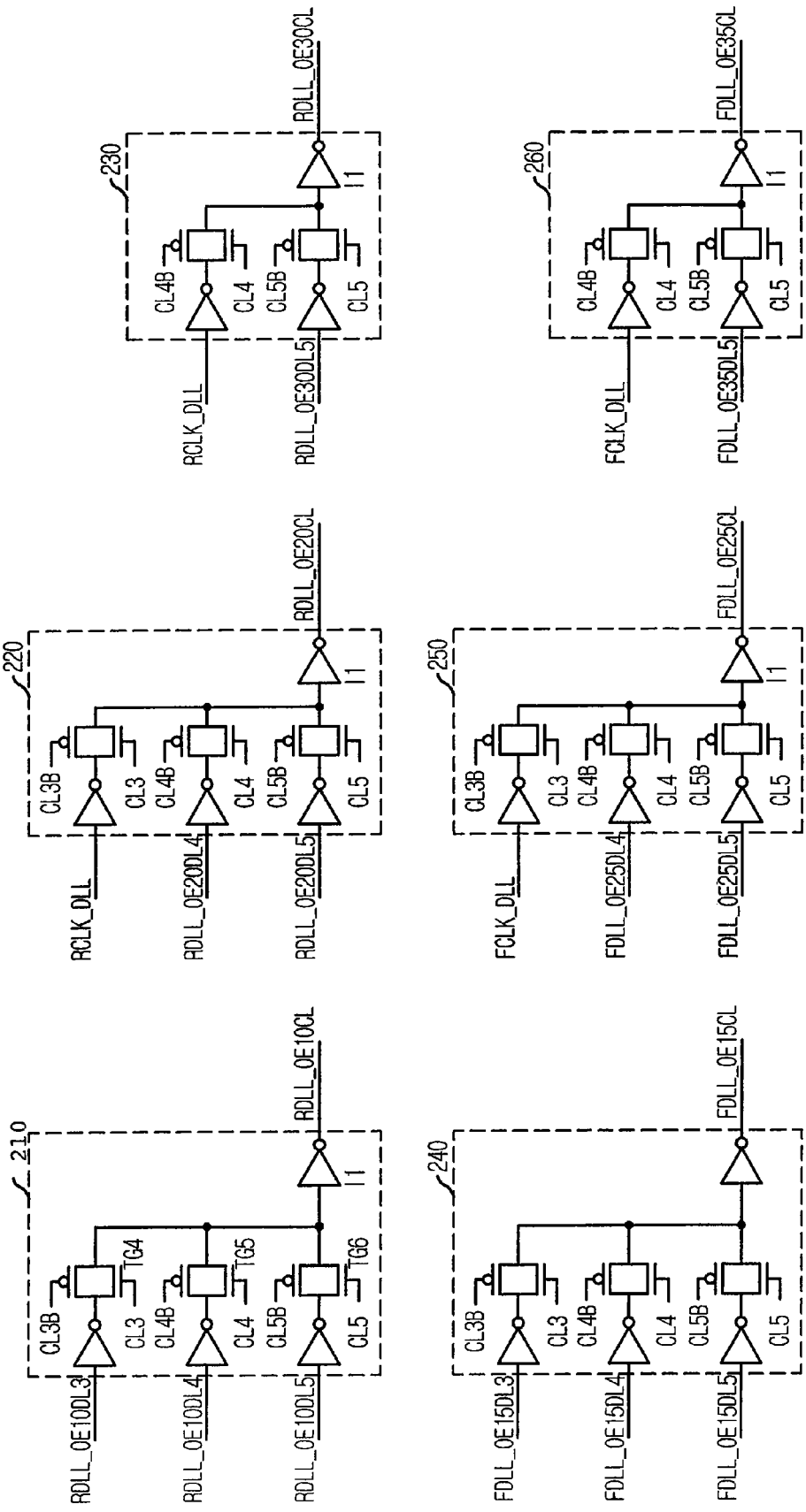
FIG. 6 is a circuit diagram of a selecting unit shown in FIG. 3.

FIG. 6 is a circuit diagram of the selecting unit 200 of FIG. 3.

Referring to FIG. 6, the selecting unit 200 includes first to sixth selectors 210, 220, 230, 240, 250 and 260 for selecting one of the output clocks of first to third clock delay units 120, 140 and 160 in response to the CAS latency information signals CL3 to CL5.

The first to sixth selectors 210 to 260 have the identical circuit configuration. Thus, the first selector 210 will be taken as an example.

The first selector 210 includes a first transfer gate TG4, a second transfer gate TG5, a third transfer gate TG6, and an inverter I1. The first transfer gate TG4 transfers the first clock RDLL_OE10DL3 among the output clocks of the first clock delay unit 120 when the CAS latency information signal CL3 is activated. The second transfer gate TG5 transfers the first clock RDLL_OE10DL4 among the output clocks of the second clock delay unit 140 when the CAS latency information signal CL4 is activated. The third transfer gate TG6 transfers the first clock RDLL_OE10DL5 among the output clocks of the third clock delay unit 160 when the CAS latency information signal CL5 is activated. The inverter I1 inverts a voltage of the common output node of the first to third transfer gates TG4 to TG6 to output the first CAS delay clock RDLL_OE10CL.

That is, the selecting unit 200 transfers a plurality of delay clocks RDLL_OE10DL3 and FDLL_OE15DL3 of the first clock delay unit 120 as the CAS delay clocks RDLL_OE10CL to FDLL_OE35CL when the CAS latency information signal CL3 is activated, or a plurality of delay clocks RDLL_OE10DL4, FDLL_OE15DL4, RDLL_OE20DL4, FDLL_OE25DL4 of the second clock delay unit 140 as the CAS delay clocks RDLL_OE10CL to FDLL_OE35CL when the CAS latency information signal CL4 is activated. Also, the selecting unit 200 transfers a plurality of delay clocks RDLL_OE10DL5, FDLL_OE15DL5, . . . , RDLL_OE30DL5, FDLL_OE35DL5 of the third clock delay unit 160 as the CAS delay clocks RDLL_OE10CL to FDLL_OE35CL.

Figure 7:
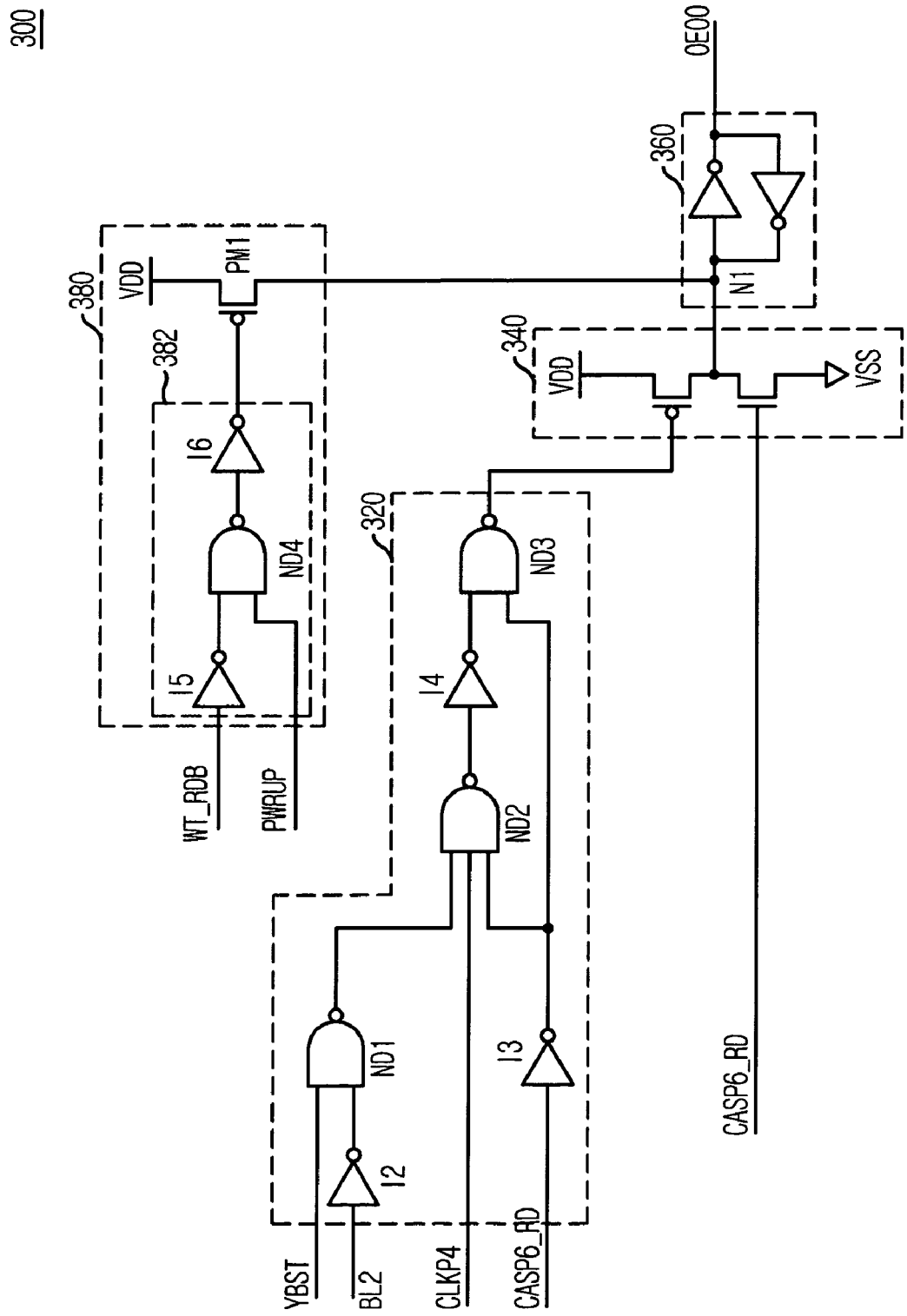
FIG. 7 is a circuit diagram of an initial synchronizing unit shown in FIG. 3.

FIG. 7 is a circuit diagram of the initial synchronizing unit 300 of FIG. 3.

Referring to FIG. 7, the initial synchronizing unit 300 includes a deactivation control unit 320, a driving unit 340, a latch unit 360, and an initializing unit 380. The deactivation control unit 320 receives a column burst command YBST and an internal clock CLKP4 to generate a deactivation control signal. The driving unit 340 drives an output node N1 in response to the read CAS signal CASP6_RD and the deactivation control signal. The latch unit 360 latches an inverted voltage of the output node and outputs the output enable signal OE00. The initializing unit 380 initializes the output node N1 in response to a power-up signal PWRUP and a write/read flag WT_RDB.

The deactivation control unit 320 includes an inverter I2 for inverting a burst length signal BL2, a first NAND gate ND1 for performing a NAND operation of an output signal of the inverter I2 and the column burst command YBST, an inverter I3 for inverting the read CAS signal CASP6_RD, a second NAND gate ND2 for performing a NAND operation of an output signal of the first NAND gate ND1, the internal clock CLKP4, and an output of the inverter I3, an inverter I4 for inverting an output signal of the second NAND gate ND2, and a third NAND gate ND3 for performing a NAND operation of the output signals of the inverters I3 and I4 to output the deactivation control signal.

The initializing unit 380 includes an initialization signal generating unit 382 for receiving the write/read flag WT_RDB and the power-up signal PWRUP to generate the initialization signal, and a PMOS transistor PM1 having a gate for receiving the initialization signal and a source-drain path between an internal voltage (VDD) terminal and the output node N1.

Operation of the initial synchronizing unit 300 will be described below briefly. First, when the read CAS signal CASP6_RD is activated to a logic high level, the driving unit 340 pulls down the output node N1 to a logic low level in response to the read CAS signal CASP6_RD. Then, the latch unit 360 inverts the voltage applied on the output node N1. The output enable signal OE00 is activated to the logic high level.

When no read CAS signal CASP6_RD is applied and the column burst command YBST is a logic low level or the burst length information signal BL2 is a logic high level, the initial synchronizing unit 300 generates the deactivation control signal in response to the internal clock CLKP4 of the logic high level, allowing the driving unit 340 to pull up the output node N1. Accordingly, the output node N1 is changed to the logic high level and the latch unit 360 inverts the level of the output node. Consequently, the output enable signal OE00 is deactivated.

When the power-up signal PWRUP is not activated because the level of the internal voltage is not stabilized during the initial driving of the device, or the write/read flag WT_RDB is set to a logic high level due to the application of the write command WT, the initializing unit 380 pulls up the output node N1. Thus, the output enable signal OE00 is deactivated regardless of the input signals.

Figure 8:
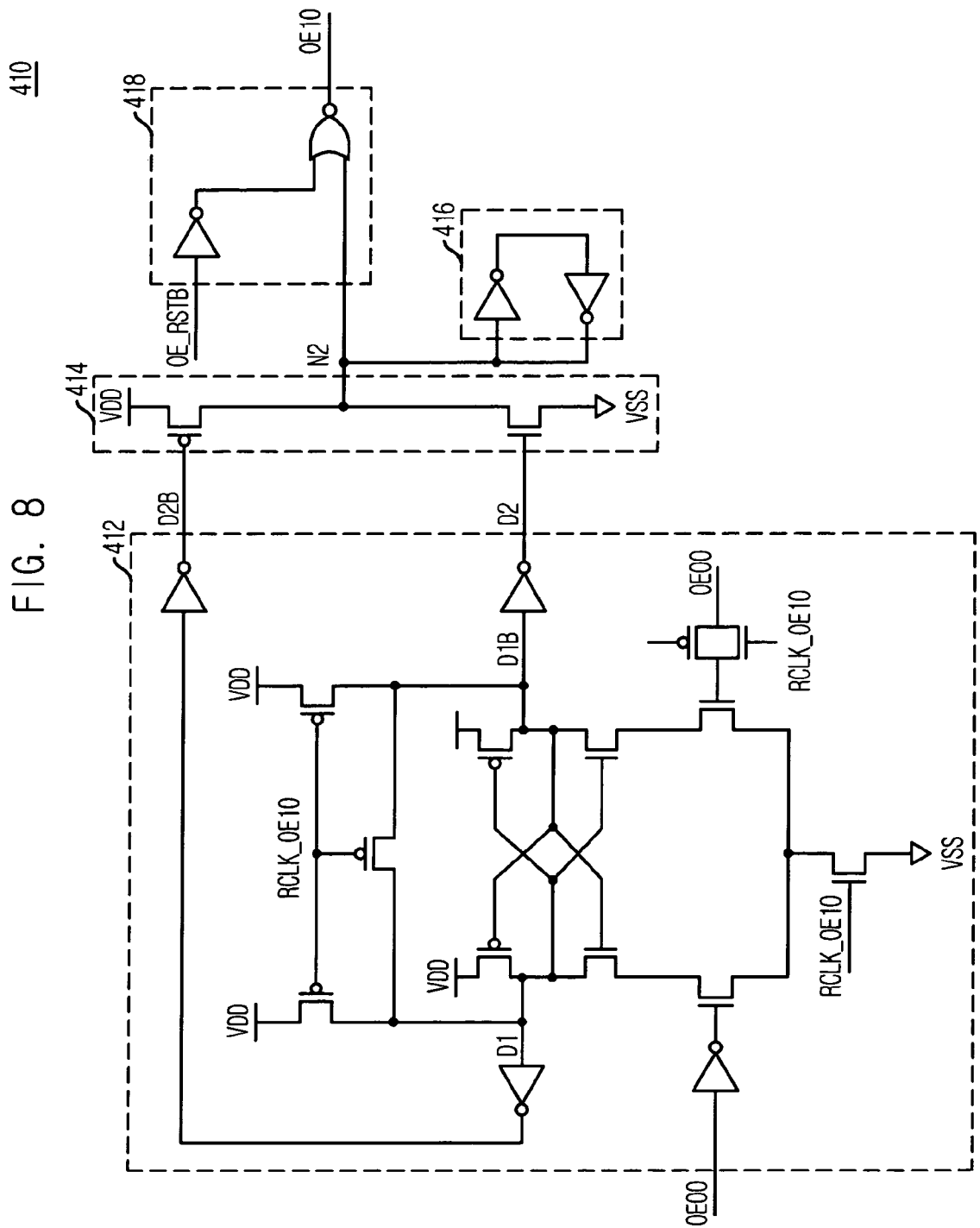
FIG. 8 is a circuit diagram of a synchronizing unit shown in FIG. 3.

FIG. 8 is a circuit diagram of the first synchronizing unit 410 of FIG. 3. The second to sixth synchronizing units 420 to 480 have the same circuit configuration with that of the first synchronizing unit 410. The first synchronizing unit 410 will be described as an exemplary structure.

Referring to FIG. 8, the first synchronizing unit 410 includes an input unit 412, a driving unit 414, a latch unit 416, and an output control unit 418. The input unit 412 receives the output enable signal OE00 in synchronization with the rising edge of the driving clock RCLK_OE10. The driving unit 414 drives an output node N2 in response to the first and second output signals D2B and D2 of the input unit 412. The latch unit 416 latches the signal applied on the output node N2 of the driving unit 414. The output control unit 418 inverts the signal applied on the output node N2 when a reset signal OE_RSTB is activated, and outputs the output enable signal OE10.

Upon the operation of the first synchronizing unit 410, when the reset signal OE_RSTB is activated to a logic low level, the output enable signal OE10 is deactivated to a logic low level regardless of the input signals. When the input signal OE00 is activated while the reset signal OE_RSTB is deactivated, the output enable signal OE10 is outputted in synchronization with the rising edge of the driving clock RCLK_OE10.

Operation of the output controller with the test unit 500 according to the first embodiment of the present invention will be described below with reference to FIGS. 3 to 8.

First, the first to third clock delay units 120 to 160 delay the input clock by their fixed delay amount to output a plurality of delay clocks. The selecting unit 200 outputs, as the CAS delay clocks, the delay clocks output from one of the first to third clock delay units 120, 140 and 160 according to the CAS latency information signals CL3 to CL5.

The test unit 500 adds an additional delay to the delay of the applied CAS delay clocks RDLL_OE10CL, FDLL_OE15CL, . . . , RDLL_OE30CL, FCLL_OE35CL according to the test-delay normal signal NO_TM, the test-delay increment signal TM_INC, and the test-delay decrement signal TM_DEC, or outputs the driving clocks RCLK_OE10, RCLK_OE15, . . . , RCLK_OE30, FCLK_OE35 without the additional delay.

Also, when the read CAS signal CASP6_RD is activated in response to the read command, the initial synchronizing unit 300 activates the output enable signal OE00 in response to the read CAS signal CASP6_RD.

Then, the first synchronizing unit 410 outputs the output signal OE00 of the initial synchronizing unit 300 as the output enable signal OE10 in synchronization with the first driving clock RCLK_OE10. The second synchronizing unit 420 outputs the output signal OE10 of the first synchronizing unit 410 as the output enable signal OE15 in synchronization with the second driving clock FCLK_OE15. The third synchronizing unit 430 outputs the output signal OE15 of the second synchronizing unit 420 as the output enable signal OE20 in synchronization with the third driving clock RCLK_OE20.

Therefore, the output controller of the claimed invention generates the plurality of output enable signals OE00 to OE45 that are activated at about half clock intervals from the activation time point of the read CAS signal CASP6_RD.

At this point, the activation time point of the output enable signals OE00 to OE45 are adjusted by the test signals NO_TM, TM_INC and TM_DEC. In other words, the activation time point is controlled by adjusting the delay amount of the driving clock applied to the synchronizing unit 400 according to the test signals NO_TM, TM_INC and TM_DEC.

The output controller may adjust the delay amount necessary for preventing the data failure according to the frequency through the adjustment of the delay amount of the driving clocks that control the activation time point of the output enable signal. That is, the present invention can solve the problem of the prior art which cannot reflect the PVT variation of the actual chip although the delay amount is given through the conventional clock delay unit.

Figure 9:
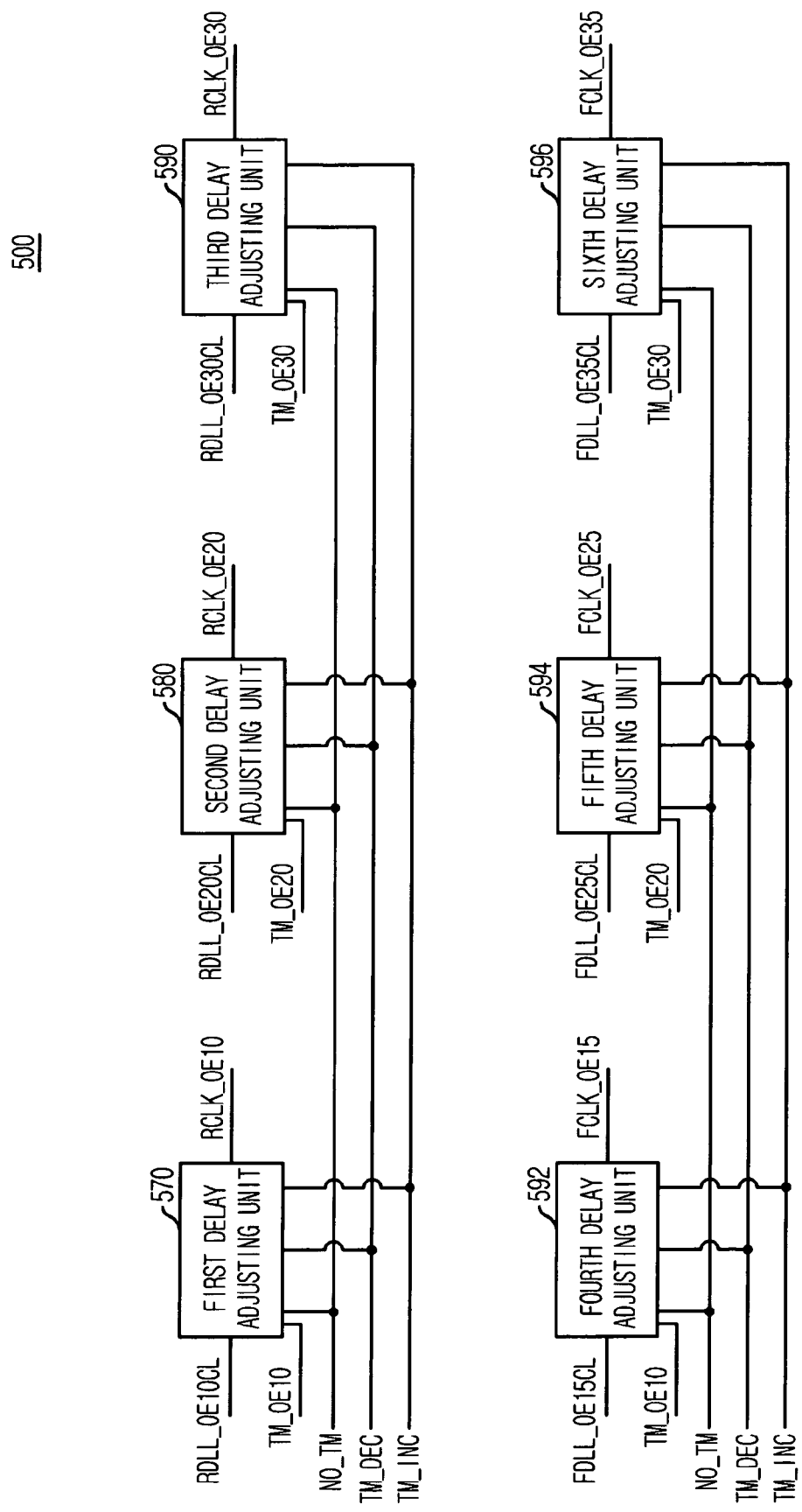
FIG. 9 is a circuit diagram of the test unit shown in FIG. 3 in accordance with a second embodiment of the present invention.

FIG. 9 is a circuit diagram of the test unit 500 of FIG. 3 in accordance with a second embodiment of the present invention.

Referring to FIG. 9, the test unit 500 includes a plurality of delay adjusting units 570, 580, 590, 592, 594 and 596 that may not only change the delay amount of the input clock according to the test-delay increment signal TM_INC, the test-delay normal signal NO_TM, and the test-delay decrement signal TM_DEC, but also determine the use of the test according to the input clock by using test off signals TM_OE10, TM_OE20 and TM_OE30.

Figure 10:
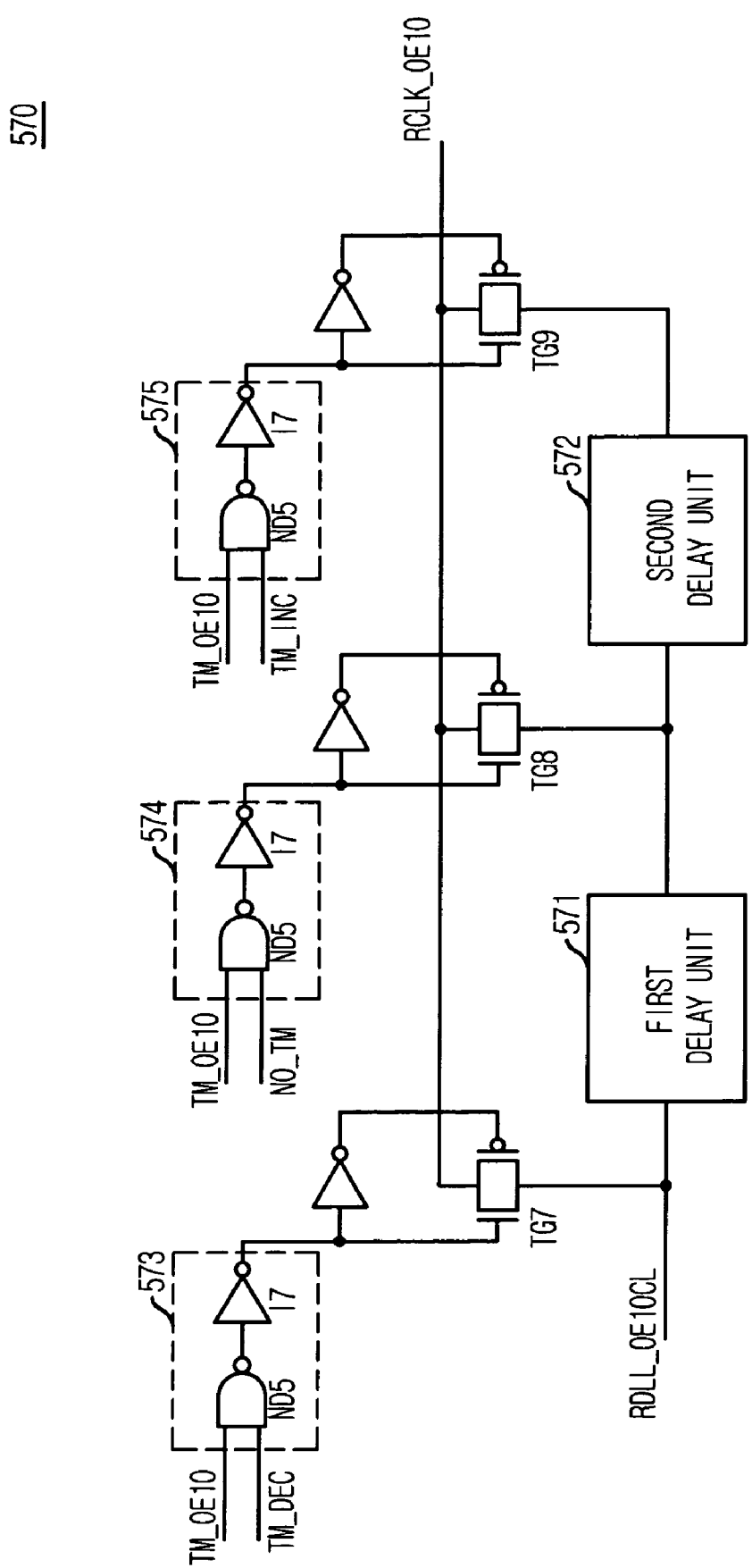
FIG. 10 is a circuit diagram of a delay adjusting unit shown in FIG. 9.

FIG. 10 is a circuit diagram of the first delay adjusting 570 unit of FIG. 9. The second to sixth delay adjusting units 580 to 596 have the same circuit configurations as that of the first delay adjusting 570. The first delay adjusting 570 is described as exemplary.

Referring to FIG. 10, the first delay adjusting unit 570 includes first and second delay units 571 and 572, first to third transfer gates TG7, TG8 and TG9, a first control unit 573, a second control unit 574, and a third control unit 575. The first and second delay units 571 and 572 are connected in series to delay the input clock RDLL_OE10CL. The first to third transfer gates TG7 to TG9 transfer the input and output signals of the first and second delay units 571 and 572 as the first driving clock RCLK_OE10 when a corresponding control signal is activated. The first control unit 573 receives the first test off signal TM_OE10 and the test-delay decrement signal TM_DEC to control the driving of the first transfer gate TG7. The second control unit 574 receives the first test off signal TM_OE10 and the test-delay normal signal NO_TM to control the driving of the second transfer gate TG8. The third control unit 575 receives the first test off signal TM_OE10 and the test-delay increment signal TM_INC to control the driving of the third transfer gate TG9.

The first to third control units 573 to 575 have the same circuit configurations, except the input signal.

The first control unit 573 includes a NAND gate ND5 for performing a NAND operation of the first test off signal TM_OE10 and the test-delay decrement signal TM_DEC, and an inverter I7 for inverting an output signal of the NAND gate ND5 to output the first control signal.

Operation of the test unit 500 in accordance with the second embodiment of the claimed invention will be described in detail. In the test unit 500, the delay amount of the driving clocks is not all controlled according to the test-delay decrement signal TM_DEC, the test-delay normal signal NO_TM, and the test-delay increment signal TM_INC, but the use of the test can be selected according to clock by using the test off signals TM_OE10 to TM_OE30.

That is, unlike the first embodiment, the test unit in accordance with the second embodiment of the claimed invention can be performed according to the driving clocks.

Since the output controller controls the activation time point of the output enable signal by using the test signal, the delay amount necessary to prevent the data fail can be adjusted according to the driving frequency and PVT variation.

Although the above description has been made of the output controller that controls the timing when data are output in response to the read command, the claimed invention can also be applied to the blocks in which a plurality of signals are activated at regular intervals when the flag signal such as the read CAS signal is applied. That is, when the plurality of signals is generated at regular intervals from the flag signal, the necessary delay amount can be adjusted according to the frequency.

The present application contains subject matter related to Korean patent application Nos. 2005-90888 & 2005-130444, filed in the Korean Intellectual Property Office on Sep. 29, 2005 & Dec. 27, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An output controller, comprising:
   an initial synchronizing unit for outputting a first output enable signal when a read CAS signal is activated;
   a plurality of stages of additional synchronizing units, connected in series, each for outputting an output signal of a previous stage as an output enable signal in synchronization with a corresponding driving clock, a first of the stages receiving the first output enable signal; and
   a test unit for adjusting a delay amount of an input clock according to a plurality of test signals and outputting the driving clock,
   wherein the test unit includes a plurality of delay adjusting units which increase or decrease the delay amount of the input clock according to a test-delay increment signal, a test-delay decrement signal, and a test-delay normal signal, and output driving clocks.

2. The output controller as recited in claim 1, wherein the delay adjusting unit outputs the driving clock by adding a normal delay to the corresponding input clock when the test-delay normal signal is activated, outputs the driving clock by adding a delay longer than the normal delay when the test-delay increment signal is activated, and outputs the corresponding input clock as the driving clock when the test-delay decrement signal is activated.

3. The output controller as recited in claim 2, wherein the delay adjusting unit includes:
   a first delay unit for delaying the input clock;
   a second delay unit for delaying an output signal of the first delay unit;
   a first transfer gate for transferring the input clock as the driving clock in response to the test-delay decrement signal;
   a second transfer gate for transferring the output of the first delay unit as the driving clock in response to the test-delay normal signal; and
   a third transfer gate for transferring an output signal of the second delay unit as the driving clock in response to the test-delay increment signal.

4. The output controller as recited in claim 3, wherein the first and second delay units include a plurality of inverters connected in series.

5. The output controller as recited in claim 1, further comprising:
   a clock delay unit for delaying a rising of a delayed lock loop (DLL) clock and a falling DLL clock by a delay amount determined according to a corresponding CAS latency information signal; and
   a selecting block for selecting a signal corresponding to CAS latency information signals among output signals of the clock delay unit, and applying the selected signal as the input clock of the test unit.

6. The output controller as recited in claim 5, wherein the clock delay unit includes:
   a first clock delay unit for delaying the rising DLL clock and the falling DLL clock according to a first CAS latency information signal to output a plurality of first delay clocks;
   a second clock delay unit for delaying the rising DLL clock and the falling DLL clock according to a second CAS latency information signal to output a plurality of second delay clocks; and
   a third clock delay unit for delaying the rising DLL clock and the falling DLL clock according to a third CAS latency information signal to output a plurality of third delay clocks,
   wherein each of the first to third clock delay units has a delay amount different from one another.

7. The output controller as recited in claim 6, wherein the selecting block outputs the plurality of first delay clocks as the input clocks when the first CAS latency information signal is activated, outputs the plurality of second delay clocks as the input clocks when the second CAS latency information signal is activated, and outputs the plurality of third delay clocks as the input clocks when the third CAS latency information signal is activated.

8. The output controller as recited in claim 7, wherein the selecting block includes first to sixth selecting units for receiving the plurality of first to third delay clocks to output one clock as the driving clock in response to the first to third CAS latency information signals.

9. The output controller as recited in claim 8, wherein the first selecting unit includes:
   a fourth transfer gate for transferring the first clock of the plurality of first delay clocks when the first CAS latency information signal is activated;
   a fifth transfer gate for transferring the first clock of the plurality of second delay clocks when the second CAS latency information signal is activated;
   a sixth transfer gate for transferring the first clock of the plurality of third delay clocks when the third CAS latency information signal is activated, and
   a first inverter for outputting the first driving clock by inverting a voltage applied on a common output node of the fourth to sixth transfer gates.

10. The output controller as recited in claim 9, wherein the initial synchronizing unit includes:
    a deactivation control unit for receiving a column burst command and an internal clock to generate a deactivation control signal;
    a first driving unit for driving an output node in response to the read CAS signal and the deactivation control signal;
    a first latch unit for latching an inverted voltage of the output node and outputting the first output enable signal; and
    an initializing unit for initializing the output node in response to a power-up signal and during a write operation.

11. A semiconductor device for controlling a data output timing, comprising:
    an initial synchronizing unit for outputting a first output enable signal when a read CAS signal is activated;
    a plurality of synchronizing units, connected in series, each for outputting an output signal of a previous stage as an output enable signal in synchronization with a corresponding driving clock, the first synchronizing unit of the plurality of synchronizing units receiving the first output enable signal; and
    a test unit for adjusting a delay amount of an input clock based on a plurality of test-delay amount adjusting signals and outputting a plurality of driving clocks in response to a plurality of test off signals.

12. The semiconductor device as recited in claim 11, wherein the test unit includes first to sixth delay adjusting units, each for outputting the input clock as the driving clock when a corresponding signal of the plurality of test off signals is activated, and outputting the driving clock by increasing or decreasing the delay amount of the input clock according to a test-delay increment signal, a test-delay decrement signal, and a test-delay normal signal when a corresponding test off signal is deactivated.

13. The semiconductor device as recited in claim 12, wherein the first delay adjusting unit includes:
a first delay unit for delaying the input clock;
a second delay unit for delaying an output signal of the first delay unit;
a first transfer gate for transferring the input clock as the driving clock in response to a first control signal;
a second transfer gate for transferring the output signal of the first delay unit as the driving clock in response to a second control signal
a third transfer gate for transferring an output signal of the second delay unit as the driving clock in response to a third control signal;
a first control unit for receiving a first test off signal and the test-delay decrement signal to generate the first control signal;
a second control unit for receiving the first off signal and the test-delay normal signal to generate the second control signal; and
a third control unit for receiving the test off signal and the test-delay increment signal to generate the third control signal.

14. The semiconductor device as recited in claim 13, wherein the first control unit includes a first NAND gate for performing a NAND operation of the first test off signal and the test-delay decrement signal, and a first inverter for inverting an output signal of the first NAND gate to output the first control signal; the second control unit includes a second NAND gate for performing a NAND operation of the first test off signal and the test-delay normal signal, and a second inverter for inverting an output signal of the second NAND gate to output the second control signal; and a third control unit includes a third NAND gate for performing a NAND operation of the first test off signal and the test-delay increment signal, and a third inverter for inverting an output signal of the third NAND gate to output the third control signal.

15. The semiconductor device as recited in claim 13, wherein the first and second delay units are implemented with a plurality of inverters connected in series.

16. The semiconductor device as recited in claim 11, further comprising:
a clock delay unit for delaying a rising DLL clock and a falling DLL clock by a determined delay amount according to corresponding CAS latency information signals; and
a selecting block for selecting a signal corresponding to the CAS latency information signal from output signals of the clock delay unit, and outputting the selected signal as the input clock of the test unit.

17. The semiconductor device as recited in claim 16, wherein the clock delay unit includes:
a first clock delay unit for delaying the rising DLL clock and the falling DLL clock according to a first CAS latency information signal to output a plurality of first delay clocks;
a second clock delay unit for delaying the rising DLL clock and the falling DLL clock according to a second CAS latency information signal to output a plurality of second delay clocks; and
a third clock delay unit for delaying the rising DLL clock and the falling DLL clock according to a third CAS latency information signal to output a plurality of third delay clocks,
wherein each of the first to third clock delay units has a delay amount different from one another.

18. The semiconductor device as recited in claim 17, wherein the selecting block outputs the plurality of first delay clocks as the plurality of input clocks when the first CAS latency information signal is activated, outputs the plurality of second delay clocks as the plurality of input clocks when the second CAS latency information signal is activated, or outputs the plurality of third delay clocks as the plurality of input clocks when the third CAS latency information signal is activated.

19. The semiconductor device as recited in claim 18, wherein the selecting block includes first to sixth selecting units for receiving the plurality of the first to third delay clocks to output one clock of the inputted clocks as the corresponding driving clock in response to the first to third CAS latency information signals.

20. The semiconductor device as recited in claim 19, wherein the first selecting unit includes:
a fourth transfer gate for transferring a first clock of the plurality of first delay clocks when the first CAS latency information signal is activated;
a fifth transfer gate for receiving a first clock of the plurality of second delay clocks when the second CAS latency information signal is activated;
a sixth transfer gate for receiving a first clock of the plurality of third delay clocks when the third CAS latency information signal is activated; and
a fourth inverter for inverting a voltage applied on a common output node of the fourth to sixth transfer gates to output the first driving clock.

21. The semiconductor device as recited in claim 20, wherein the initial synchronizing unit includes:
a deactivation control unit for receiving a column burst command and an internal clock to generate a deactivation control signal;
a driver for driving an output node in response to the read CAS signal and the deactivation control signal;
a latch unit for inverting a voltage applied on the output node, latching the inverted voltage, and outputting the latched signal as the first output enable signal; and
an initializing unit for initializing the output node in response to a power-up signal and a write operation.

22. An output controller, comprising:
a plurality of synchronizing units connected in series, each for outputting a plurality of interval signals by synchronizing an output signal of a previous stage with a corresponding driving clock, a first synchronizing unit of the plurality of synchronizing units receiving a flag signal; and
a test unit for adjusting a delay amount of an input clock according to a plurality of test signals to output the driving clock,
wherein the test unit includes a plurality of delay adjusting units for increasing or decreasing the delay amount of the input clock according to a test-delay decrement signal, a test-delay increment signal and a test-delay normal signal, and outputting the respective driving clock.

23. The output controller as recited in claim 22, wherein the delay adjusting unit outputs the driving clock by adding a normal delay to the corresponding input clock when the test-delay normal signal is activated; outputs the driving clock by adding a delay longer than the normal delay when the test-delay increment signal is activated; and outputs the corresponding input signal as the driving clock when the test-delay decrement signal is activated.

24. The output controller as recited in claim 23, wherein the delay adjusting unit includes:
   a first delay unit for delaying the input clock;
   a second delay unit for delaying an output signal of the first delay unit;
   a first transfer gate for transferring the input clock as the driving clock in response to the test-delay decrement signal;
   a second transfer gate for transferring the output signal of the first delay unit as the driving clock in response to the test-delay normal signal; and
   a third transfer gate for transferring an output signal of the second delay unit as the driving clock in response to the test-delay increment signal.

25. A semiconductor device for controlling a data output timing, comprising:
   a plurality of synchronizing units connected in series, each for outputting a plurality of interval signals by synchronizing an output signal of a previous stage with a corresponding driving clock, a first synchronizing unit of the plurality of synchronizing units receiving a flag signal; and
   a test unit for adjusting a delay amount of a signal selected from input clocks based on a plurality of test-delay amount adjusting signals and outputting the plurality of driving clocks in response to a plurality of test off signals.

26. The semiconductor device as recited in claim 25, wherein the test unit includes first to sixth delay adjusting units for outputting the input clock as the driving clock when a corresponding signal of the plurality of test off signals is activated, and outputting the driving clock by increasing or decreasing the delay amount of the input clock according to a test-delay increment signal, a test-delay decrement signal, and a test-delay normal signal when the corresponding test off signal is deactivated.

27. The semiconductor device as recited in claim 26, wherein the first delay adjusting unit includes:
   a first delay unit for delaying the input clock;
   a second delay unit for delaying an output signal of the first delay unit;
   a first transfer gate for transferring the input clock as the driving clock in response to a first control signal;
   a second transfer gate for transferring the output signal of the first delay unit as the driving clock in response to a second control signal;
   a third transfer gate for transferring an output signal of the second delay unit as the driving clock in response to the third control signal;
   a first control unit for receiving a first test off signal and the test-delay decrement signal to generate the first control signal;
   a second control unit for receiving the first off signal and the test-delay normal signal to generate the second control signal; and
   a third control unit for receiving the test off signal and the test-delay increment signal to generate the third control signal.

28. The semiconductor device as recited in claim 27, wherein the first control unit includes a first NAND gate for performing a NAND operation of the first test off signal and the test-delay decrement signal, and a first inverter for inverting an output signal of the first NAND gate to output the first control signal; the second control unit includes a second NAND gate for performing a NAND operation of the first test off signal and the test-delay normal signal, and a second inverter for inverting an output signal of the second NAND gate to output the second control signal; and a third control unit includes a third NAND gate for performing a NAND operation of the first test off signal and the test-delay increment signal, and a third inverter for inverting an output signal of the third NAND gate to output the third control signal.

* * * * *